United States Patent
Gasseling

(10) Patent No.: US 8,269,508 B2
(45) Date of Patent: Sep. 18, 2012

(54) METHOD AND SYSTEM FOR OPTIMAL SOURCE IMPEDANCE MATCHING AT THE INPUT OF ELECTRONIC COMPONENTS, PARTICULARLY TRANSISTORS

(75) Inventor: Tony Gasseling, La Souterraine (FR)

(73) Assignee: AMCAD Engineering, Limoges (FR)

( * ) Notice: Subject to any disclaimer, the term of this patent is extended or adjusted under 35 U.S.C. 154(b) by 280 days.

(21) Appl. No.: 12/818,301

(22) Filed: Jun. 18, 2010

(65) Prior Publication Data
US 2010/0321033 A1   Dec. 23, 2010

(30) Foreign Application Priority Data
Jun. 18, 2009 (FR) ...................... 09 02961

(51) Int. Cl.
*G01R 35/00* (2006.01)
(52) U.S. Cl. .......................... 324/601; 702/85
(58) Field of Classification Search .............. 324/601, 324/600, 74, 130, 202, 750.02; 702/85, FOR. 156; 73/1.01; 340/870.04, 501; 361/148
See application file for complete search history.

(56) References Cited

U.S. PATENT DOCUMENTS

| | | | | |
|---|---|---|---|---|
| 5,790,334 A * | 8/1998 | Cunningham | .................. | 360/66 |
| 6,714,833 B2 * | 3/2004 | Nakano et al. | ................. | 700/121 |
| 6,859,031 B2 * | 2/2005 | Pakdaman et al. | ............ | 324/233 |
| 2003/0076125 A1 * | 4/2003 | McCord | ........................ | 324/765 |
| 2008/0197786 A1 * | 8/2008 | Schaible et al. | ............... | 315/224 |

FOREIGN PATENT DOCUMENTS

WO   2005121817 A1   12/2005

OTHER PUBLICATIONS

T. Biondi et al.; Large-Signal Source/Load-Pull Verification of an ST-SPICE Gummel-Poon Model for RF Silicon Power Bipolar Transistors; Electron Devices for Microwave and Optoelectronic Applications, 2002; EDMO 2002; The 10th IEEE International Symposium on Nov. 18-19, 2002, Piscataway, NJ; pp. 196-201; XP010625952; ISBN: 978-0-7803-7530-7; p. 197, line 17 and p. 198, line 45.

French Search Report dated Feb. 19, 2010.

* cited by examiner

*Primary Examiner* — Hoai-An D Nguyen
(74) *Attorney, Agent, or Firm* — Bachman & LaPointe, P.C.

(57) ABSTRACT

A method for determining optimal source impedance at the input of a device under testing (DUT) in a measurement bench, includes the steps of calibrating a source pull type bench as a measurement bench, adjusting a load impedance and continuous bias of the DUT, generating an electric power signal by the source and injected in the DUT, acquiring input impedances of the DUT and corresponding gain performances.

3 Claims, 5 Drawing Sheets

METHOD AND SYSTEM FOR OPTIMAL SOURCE IMPEDANCE MATCHING AT THE INPUT OF ELECTRONIC COMPONENTS, PARTICULARLY TRANSISTORS

BACKGROUND OF THE INVENTION (1) Field of the Invention

The invention relates to a method for optimal source impedance matching at the input of electronic components, particularly transistors.

(2) Prior Art

The electronic components of transistor type are employed in the radio frequency (RF) and hyper frequency (HF) electronic circuits to amplify the power of an input signal.

These components are in principle impedance mismatched. Consequently, if no particular attention is given regarding the introduction conditions of these components in a given electronic circuit, the majority of the incident signal is reflected at the input of the component. This signal will thus not be amplified.

Consequently, it is essential to perform impedance matching of this component input. This is particularly done by matching circuits or tuners. These tuners make it possible to decrease the quantity of reflected signal at the input, and thus to maximize the quantity of inputted signal into the component which will be amplified thereafter. A tuner is a transformer that performs a transition between the characteristic output impedance of the electronic circuit providing the signal to the component and the input impedance of said component.

Thus, a maximized signal transfer requires a prior knowledge of these two impedances. Such maximization brings into play the notions of transducer gain and power gain of the device under testing, hereinafter named DUT. The power gain is the ratio between the output power provided to the load and the output capacity injected at the input of the DUT. The transducer gain is the ratio between the output power provided to the load and the available gross power at the input of the DUT originating from the source. Thus, the power gain corresponds to the transducer gain when the power transfer at the input is maximal, namely, when the impedance matching is achieved between the DUT and the source. All the available power at the source is transferred and injected in the DUT.

The knowledge of impedances is reached based on power measurements usually carried out by bolometers connected to the circuit by means of measurement couplers. To gain access to this information, the measurement benches used implement input and output impedance tuners of the DUT, and input couplers either upstream or downstream from the input tuner.

The technique of general reference, so-called "source pull"/"load pull" (from the source/from the load) is illustrated respectively in FIGS. 1a and 1b, brings in to play input couplers, 10 and 12, for measuring incident and reflected signals at the input of the DUT (here a transistor), respectively in upstream and downstream configuration of the input tuner 14 in a measurement bench B. An outer power supply 2 makes it possible to supply current and voltage via Bias tees, 3 and 4 on both sides of the DUT when the DUT does not have inner bias circuits (which is the case for a transistor). The same references designate the same elements of FIGS. 1a and 1b. Such techniques are described for example in patent documents U.S. Pat. No. 7,248,866, CA 2558861 and CA 2549698.

With reference to FIG. 1a, the input tuner 14 varies the impedance provided by source 1 at the DUT input. This impedance is then adjusted by adjusting an optimal source impedance at the input of the DUT in order to minimize the reflected power and thus to maximize the transducer power gain. The optimization is obtained from the ratios of reflected power measurements, carried out by a bolometer 12b connected to the input coupler 12 measuring the reflected signal, to the measurements of incident power carried out by a bolometer 10b connected to the coupler 10 measuring the incident signal.

In "load pull" measurement, the technique is similarly applied at the output: it consists in varying the load impedance provided at the output of the DUT by means of an output tuner 16. The load impedance is thus optimized using the output tuner at the output of the DUT in order to maximize the output power. The optimization results from the maximization of the transducer power gain.

The input and output tuners are mechanical tuners driven by stepping motors and for carrying out an automatic search of the optimal matching conditions. They are pre-calibrated and, for each adjustment, an integrated memory makes it possible to know the losses and impedances of these tuners with respect to the signals and micro-waves used.

When the input 10, 12 and output 22, 24 couplers are in downstream configuration from the input 14 and output 16 tuner (FIG. 1b), the impedances are—module and phase-measured at the input and output of the DUT by a vector network analyzer 20. This analyzer is connected to bench B by input couplers 10 and 12 and by output couplers 22 and 24 by means of incident and reflected coupled channels respectively V1 and V3, V2 and V4.

After calibration, the vector network analyzer 20 thus makes it possible to derive the incident power, the reflected power at the input of the DUT as well as the output power provided to the load. In upstream configuration, this power is measured by a bolometer 17 at the output of tuner 16.

The techniques mentioned are useful when the DUT is directly subjected to a power signal from the source 1, as the applied power level thus influences the determination of the optimal impedances.

However, these test techniques are no longer useful when the DUT is operating in linear conditions: in this case, the determination of the conditions may be carried out based on weak signal measurements in terms of power by a known formalism of S-parameter type.

With respect to the upstream configuration, the downstream configuration makes it possible to avoid a delicate prior calibration of the tuners, the impedance values being directly known by the vector network analyzer 20. The calibration of the tuners is delicate as it is linked to the mechanical repeatability of the mobile elements of the tuner, and to the mechanical stability of the arrangement carried out for the test.

The main problem pertains to the circuit losses present between the DUT and the tuners. In fact, it is sometimes necessary to place devices between these two elements, such as adaptors, cables or Bias tees 3 and 4 (see FIGS. 1a and 1b) allowing to couple a continuous signal and an alternating signal. The latter elements are essential when the DUT does not have inner bias circuits. In this case, the power supply of the DUT is done by means of these outer bias circuits.

The major drawback of the downstream configuration is that it increases the signal losses between the tuners and the DUT, owing to the presence of measurement couplers: the impedance area that may be used is thus substantially reduced at the DUT plane as, due to additional power losses in these elements, the so-called optimal impedances cannot always be synthesized. Generally, the greater the power losses between the tuner and the DUT, the more restrained the impedance area able to be synthesized will be which results in a misrecognition of the DUT optimal performances as the optimization achieved with tuners is not maximized.

These losses thus limit the impedance range that could be exhibited. This is linked to the energy losses in the Bias tees, the couplers, the cables or adaptors located between the DUT and the impedance tuners.

In order to remedy to this problem, it has been proposed to use tuners capable of intrinsically synthesizing a wide range of impedances, either by improving the mechanical characteristics of the tuners, or by associating the latter with active electronic elements. Patent document U.S. Pat. No. 7,053,628 cites these types of means.

Another solution consists in placing between the DUT and the tuners, circuits having the lowest possible losses as described in patent document US 2003107363 or U.S. Pat. No. 6,414,563. These solutions do not permit solving the above problem satisfactorily.

SUMMARY OF THE INVENTION

The invention aims to implement a "source pull" type technique that makes it possible to solve said problem by avoiding the limitation imposed by the source impedance synthesis, by using a measurement technique that makes it possible to even avoid using a tuner at the input of the DUT.

According to the invention, contrary to the classical measurement benches, the source impedance is defined theoretically, and not physically. Based on this theoretical source impedance, it is possible to calculate the theoretical available power that would be provided by this source. This invention is based on the postulate that the DUT is perfectly unilateral, namely that the source impedance exhibited does not impact the output impedance exhibited by the DUT.

A succinct theoretical approach relating to the background of the invention is addressed briefly in patent WO2005121817. However, the author mentions very briefly the benefits of this approach, and does not comment on the fact that it is only valid if the DUT is absolutely unilateral.

Based on the postulate of perfect unilaterality of the DUT, the spirit of the invention exhibited here differs by the fact that it consists in calculating, and not arbitrarily setting, the available equivalent power that would be provided by a given inner impedance source expressed in its complex form.

More specifically, the object of the present invention is a method for determining optimal source impedance at the input of a device under testing (DST) in a measurement bench, comprising the steps of:

calibrating a source pull type bench as a measurement bench, adjusting a load impedance and continuous bias of the DST, generating an electric power signal by the source and injected in the DST, acquiring input impedances of the DUT and corresponding gain performances, wherein:

a theoretically-defined source impedance is adjusted over a measured input impedance of the DST, the acquisition of transducer power gain performances for the source impedance is determined according to the theoretically-defined source impedance, the measure of the load impedance of the DUT, as well as the measurement of the net power injected at the input of the DUT and the output power of the DST, a performance deviation according to the mismatchings calculated between the theoretical source impedance and the measured input impedance of the DUT is determined, and in the case where the deviation is higher than a reference value, at least one new source impedance is theoretically defined until iteratively obtaining a deviation lower than the reference value, and the transducer gain performances of the DUT from this source impedance are thus determined.

Once this cycle completed for a first given load impedance, a new source impedance may then be defined theoretically for a new load impedance or another DUT by repeating the previous cycle.

The present solution eliminates the physical restrictions which may limit the determination of the performances obtained under optimal operating conditions owing to the use of means making it possible to simulate physical means, namely, the input tuner. In this configuration, the signal losses between the coupler and the DUT are no longer an issue. A wide range of results is presently accessible, such as those which would be obtained with an input measurement coupler without loss.

Another advantage is to avoid the necessity of carrying out a measurement for a given source impedance, in order to know the DUT performances for this said source impedance. For example, if the user wanted to know the performances obtained for X different source impedances, X measurements would need to be carried out by changing this source impedance every time.

Furthermore, once the measurements carried out, it is difficult to know a posteriori the results which would have been obtained for other source impedances. Some parameters are in fact quite sensitive to the variation of the source impedance, such as the transducer gain expansion according to the power level. For given operating conditions, the transducer gain expansion corresponds to the increase of the transducer gain according to the available input power up to a limit value beyond which the gain decreases.

Hence, basic interpolation methods cannot be used with a high level of confidence. Hence, another advantage of the invention is to be able to use a posteriori the results obtained in order to extract new ones based on new simulated values of source impedance without redoing new measurements.

Also, the invention also makes it possible to define the optimal operating conditions of the transistor according to several parameters which may be transducer power gain, gain compression, power efficiency. Performance acquisition of each parameter for the source impedance is determined according to the theoretical source impedance, the measured load impedance at the DUT, as well as the net power injected at the input and the output power measured at the DUT reference planes. The cyclical optimization is thus achieved as described previously by taking into account not only one but several reference values relating to each measured magnitude.

The invention further relates to a system for determining optimal source impedance at the input of a DUT comprising a calibrated "source pull" type measurement bench, wherein this bench determines theoretical source impedance values, and impedance values measured at the input of the DUT, in order to implement the previous method, by means of a vector network analyzer, input and output power values of the DUT using couplers arranged respectively at the input and output of the DUT.

BRIEF DESCRIPTION OF THE DRAWINGS

Other characteristics and advantages of the invention will become apparent from the following exemplary embodiment, with reference to the accompanying drawings which represent respectively.

In the figures a same reference designates an identical member.

DETAILED DESCRIPTION OF THE PREFERRED EMBODIMENT(S)

Figure 1A:
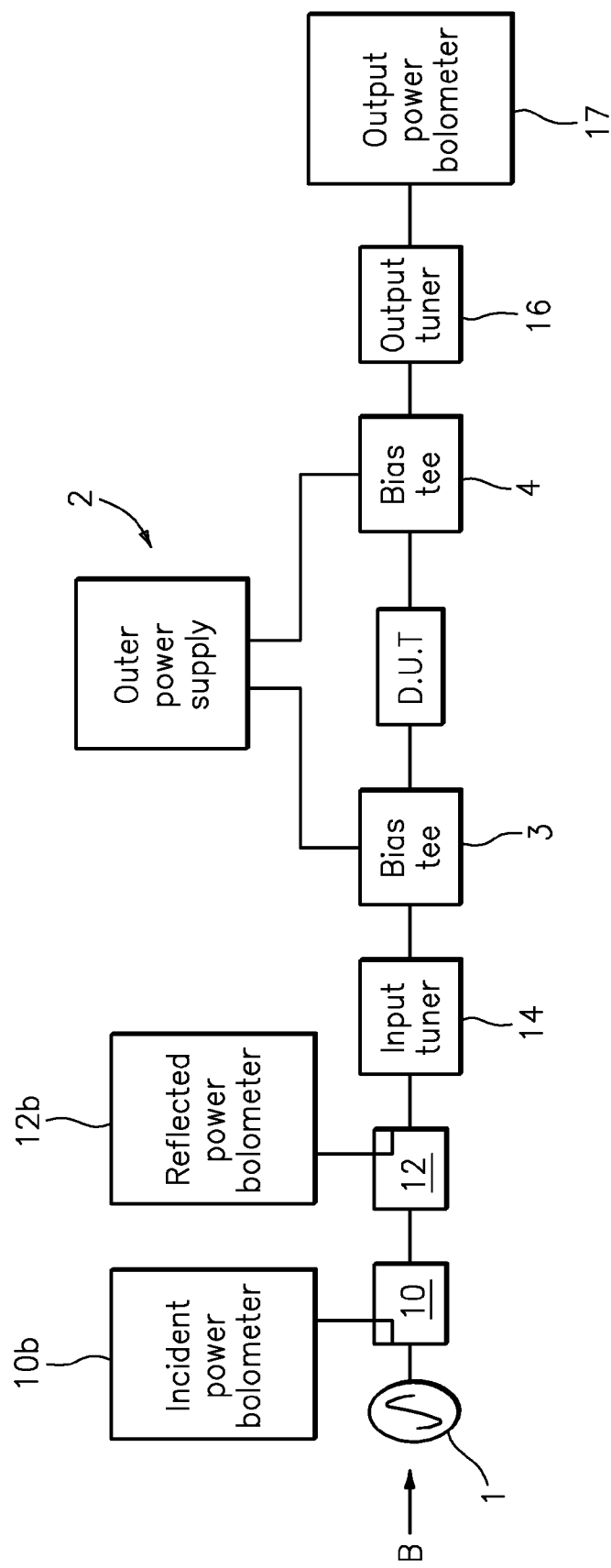
FIG. 1*a*, the drawing of the classical measurement bench in source/load pull mode in upstream configuration (already commented)
Figure 1B:
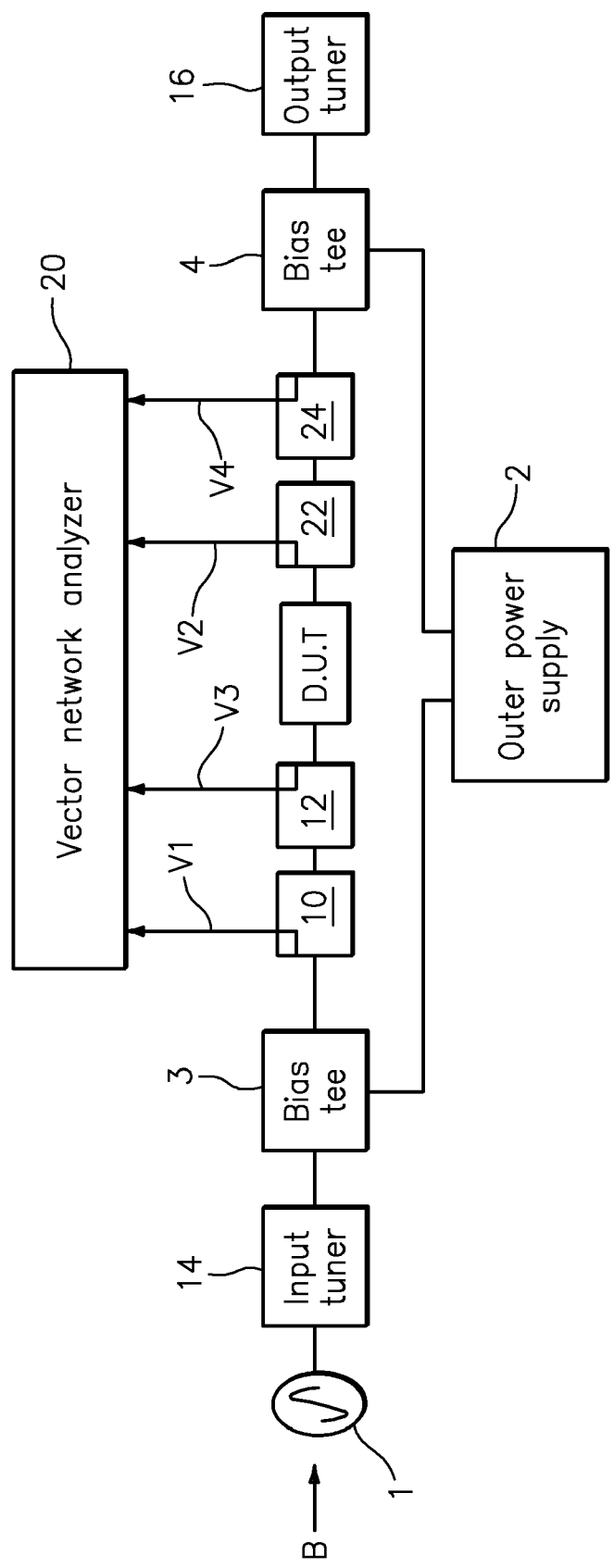
FIG. 1*b* the drawing of the classical measurement bench in source/load pull mode in downstream configuration (already commented)
Figure 2:
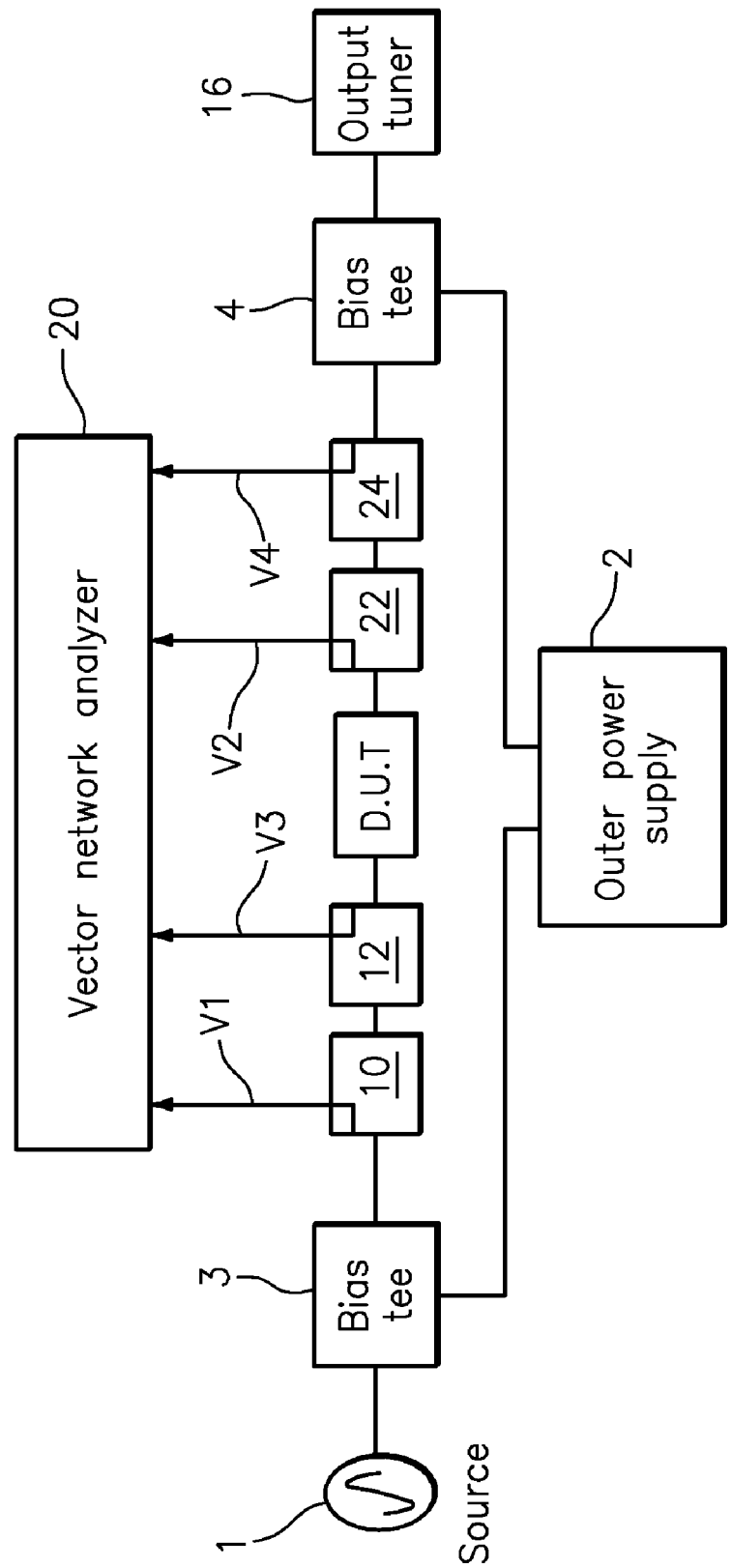
FIG. 2 an example of a drawing of a measurement bench used for the implementation of the invention.

The measurement bench illustrated in FIG. 2 is a downstream source pull bench which differs from the bench illustrated in FIG. 1*b* by the absence of input tuner 14 (FIG. 1*b*). This absence implies an input physical mismatching between the source 1 and the DUT to be tested, but this mismatching is independent from the determination of the optimal conditions and the corresponding results obtained according to the invention by a matching simulation of the DUT.

In this example, the DUT is a field-effect transistor. The testing fundamental frequency f0 is of 4 GHz. The fundamental load impedance ZL exhibited at the output of the DUT is of 81.3+J51.6 Ohms. Thanks to the use of an output multi-harmonic load tuner 16, the harmonic impedances of frequencies 2f0 and 3f0 are adjusted on 50Ω. The continuous bias of the DUT is equal to Vgs0=−0.68V on the left, Vds0=7V on the right and Ids0=30 mA in intensity.

The magnitudes measured in fundamental frequency f0 are:

the power POUT at the output of the DUT, equal to 953 µW, measured by the output couplers 22 and 24, the injected net power <<PIN>> at the DUT, is equal to 2.17 µW, and, the load impedance "ZL" of the DUT which equals 2.3-J31.17Ω, the values PIN and ZL being provided by the vector network analyzer 20.

These magnitudes are independent from the theoretically chosen source impedance.

The power available in the input plane of the DUT is, by calculation, the power PAV delivered by a generator equivalent to the source 1 of theoretical inner impedance ZG which differs by 50Ω, a reference value commonly used in the applications of radio and microwave measurements.

The value of the calculated available input power PAV is derived from the input power values "PIN", of the input impedance "ZIN=RIN+jXIN" (measured) and "ZG=RG+jXG" (given), by the intermediary calculation of the electromotive force Eg of the equivalent generator, without needing to physically put in place such an impedance to carry out its measurement, in order to avoid any inaccuracy and any limitation of a range of values generated by an input tuner.

$$E_G^2 = 2\frac{P_{IN}}{R_{IN}}[(R_G + R_{IN})^2 + (X_G + X_{IN})^2] \quad \text{(eq. 1)}$$

-continued $$P_{AV} = \frac{1}{8}\frac{|E_G|^2}{R_G} \quad \text{(eq. 2)}$$

For each given impedance value ZG, the transducer power gain value is thus directly derived from the ratio POUT/PAV between the output power POUT delivered to the load and the calculated available power PAV depending on the impedance ZG, corresponding to the inner source impedance of the equivalent generator.

Other characteristics of the DUT associated to a given environment, such as the power efficiency, the gain compression or expansion, may also be derived by calculation.

By a posteriori determining the results obtained for another source impedance, it is thus advantageous to be able to attain several simultaneous objectives—for example a given output power associated to a compression of maximum transducer gain—, whereas the traditional testing method requires the measurement of the transducer power gain for every source impedance synthesized by the input tuner. For the record, the transducer gain compression is the deviation between the transducer gain measured for a given power level and the maximum transducer gain value obtained over the entire power variation range.

Thus, by using the method according to the invention, the transducer gain values are determined for every theoretically-defined source impedance, whereas the classical method requires as many measurements as different source impedances.

Traditionally, the classical method requires synthesizing X, for example eight different source impedances by the source tuner to measure the transducer power gain and implement X different characteristics.

Figure 3:
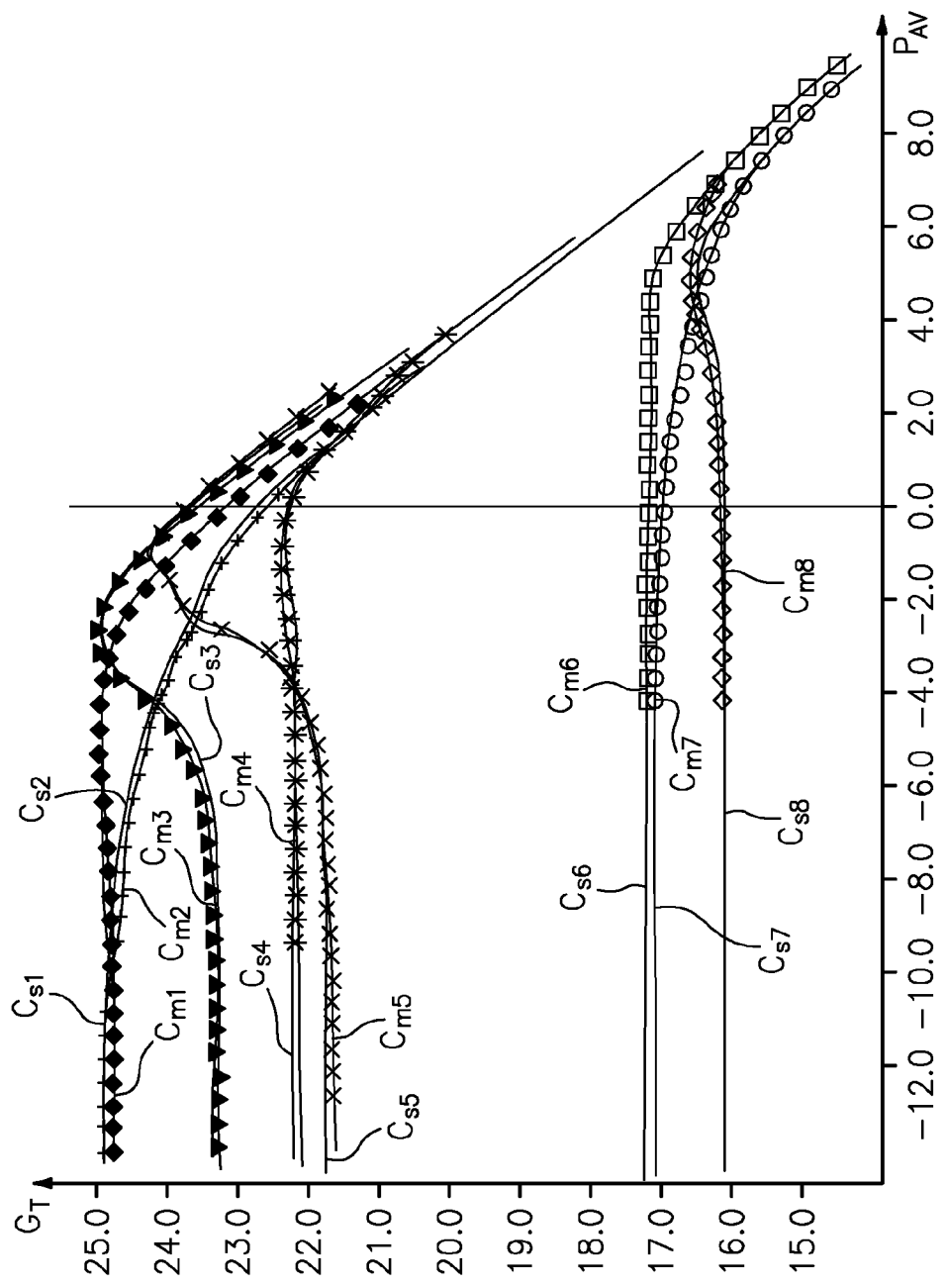
FIG. 3, a comparative drawing representing the transducer gain curves of a transistor, obtained for eight source impedances measured or given theoretically according to the method of the invention, and FIG. 4, a flowchart of the main steps of the method according to the invention.

FIG. 3 illustrates a comparative drawing of:

the curves drawn by points using a classical method, Cm1 to Cm8, of the transducer power gain Gt of the tested transistor, according to a scanning of available powers Pav measured at the input of the DUT, and the simulated smooth curves Cs1 to Cs8 of this transducer power gain calculated by the calculation method illustrated above and reproduced for different available powers.

By way of example, these curves are obtained for eight source impedances, either synthesized (Zs1 to Zs8) according to the classical method or given theoretically (ZG1 to ZG8) according to the method of the invention. In this example, for each curve, every source impedance ZG corresponds to the value of the source impedance ZS measured during the use of the classical source pull bench.

The curves by points Cm1 to Cm8, and simulated Cs1 to Cs8, that retrace the appearance of the transducer power gain Gt according to the power level, substantially overlap for each of the 8 source impedances.

Thus, it appears that the method used makes it possible to reproduce in a calculated manner the measured transducer power gain values obtained from the entire scanning of powers of the eight synthesized source impedances. It is thus justified to apply this calculation method for other ranges of impedance and for any type of characteristics of the DUT. This technique may be applied accurately in order to obtain results when the source impedance intervenes only on the matching conditions at the input of the DUT. If the source impedance also affects the intrinsic operation of the DUT, this technique thus only constitutes an approximation tool, but provides relatively reliable results.

Figure 4:
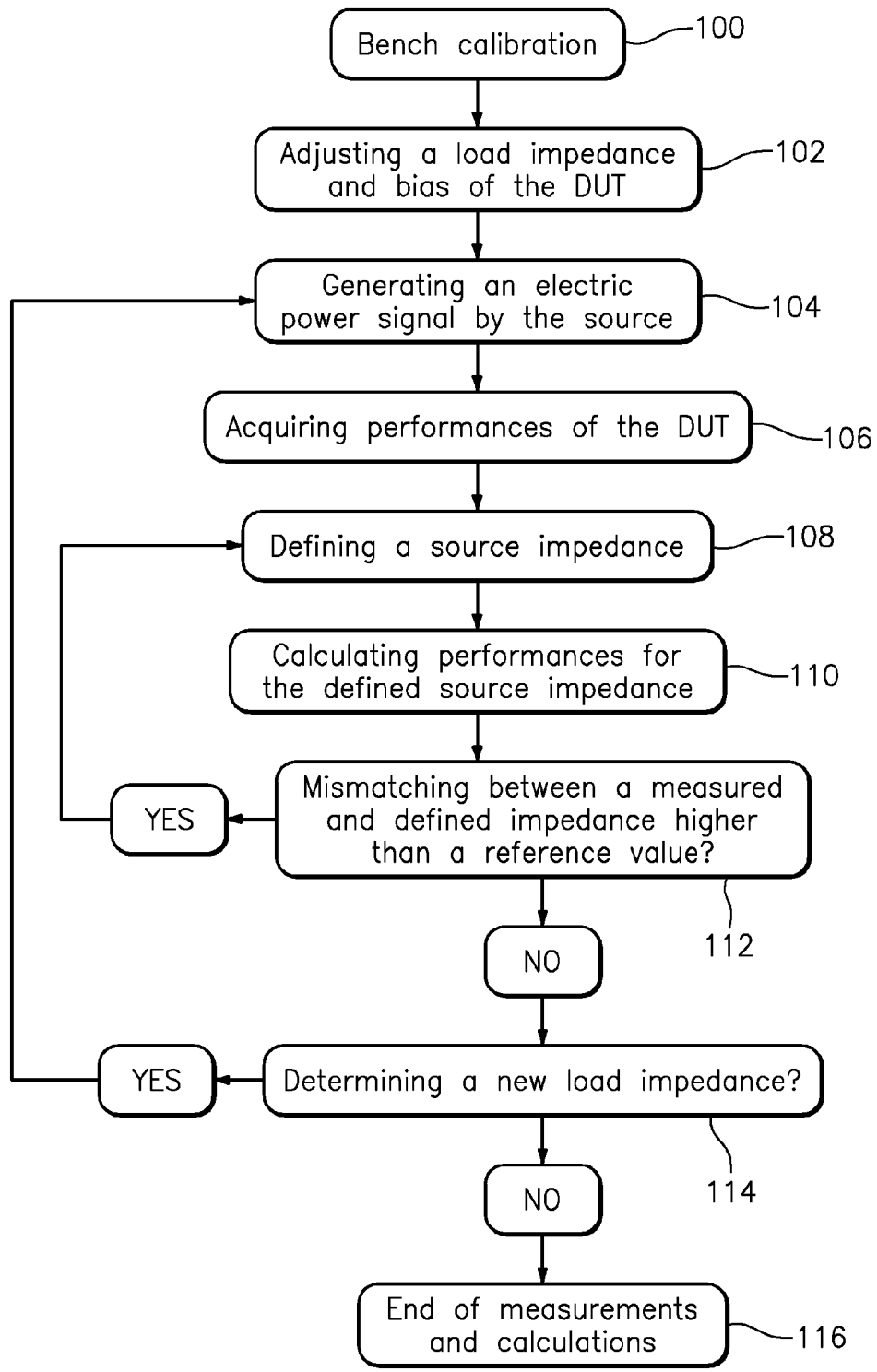

The flowchart illustrated in FIG. 4 resumes the different phases of the method according to the invention:

calibrating 100 a source pull type bench in downstream configuration as a measurement bench, adjusting 102 a load impedance ZL and continuous bias of the DST, generating 104 an electric signal of injected power PIN by the source in the DST, acquiring 106 power gain performances in a measurement environment corresponding to the source impedances ZS (ZS1 to ZS8 in the example) exhibited at the input of the DUT and, wherein:

a given source impedance ZG is adjusted on a measured input impedance ZIN (step 108), calculating 110 transducer power gain performances GT for the given source impedance ZG is determined according to this given source impedance ZG, the input impedance ZIN of the DUT, the available power delivered by the equivalent generator PAV, expressed by means of the electromotive force Eg of this generator, and the output power POUT of the DUT.

For each injected net power level PIN delivered by the source, a mismatching calculation between the input impedance of the DUT ZIN such as measured and the given source impedance ZG is carried out. This calculation thus provides all the data necessary to calculate magnitudes such as transducer power gain, transducer power efficiency and even the available power PAV of the equivalent generator at the input plane of the DUT according to the adopted source impedance.

A deviation of performances according to mismatchings between the simulated source impedance and the synthesized input impedances is thus determined (step 112).

In the case where the deviation is higher than a reference value freely set by the user, at least one new source impedance ZG is defined by looping the step 108 until iteratively obtaining a deviation lower than the reference value, and the gain performances of the DUT based on this source impedance are thus determined.

Once this cycle is completed for one first given load impedance, a new load impedance can then be determined (step 114 and looped-back on step 104) for a new load impedance by resuming the previous simulation cycle. The measurements and calculations are terminated when the set of load impedances have been analyzed (step 116).

The invention is not limited to the examples described and represented. Thus, a proposed alternative method would be to measure the input impedance at the DUT by using another method than the one previously described, and to recalculate a posteriori the mismatching between the measured input impedance at the DUT and the adopted theoretical source impedance.

For example, the input impedance at the DUT is measured here above with a vector network analyzer connected on an outer measurement coupler at the input of the DUT. But the measure of the input impedance at the DUT may also be carried out based on other measurement tools liable to measure a module and phase complex impedance, in the frequency or temporal domain.

Thus, it is possible to measure the input impedance at the DUT with different measurement tools, or different types of circuit arrangement. For example the input impedance at a DUT may be measured based on measurements carried out using a vector network analyzer through a pre-calibrated source tuner. In fact, by knowing the characteristics of this tuner, based on a measurement carried out upstream from said tuner, it is possible by calculation to go back to the impedance seen downstream of the tuner. It has been shown that the invention makes it possible to avoid the physical limitations of the input tuner and even do without this tuner.

However, the theoretical knowledge of the optimal performances does not prevent from physically getting closer to these conditions by the presence of a source tuner, in order to use a lower-level source signal as the reflection of the signal is thus minimized by the physical matching.

Furthermore, the invention may be applied if the use of couplers measuring the incident and reflected power at the entries of the DUT is replaced by any type of device making it possible to measure these magnitudes.

Thus, knowing the theoretical optimal source impedance thanks to the invention, the source tuner may be used to get closer to the optimal matching conditions by limiting the magnitude of signal reflected physically at the input of the DUT during the tests. Otherwise, without a tuner, the majority of the power is reflected at the input of the DUT, and it is thus suitable to use a greater level source signal in order to conduct the tests.

One of the main advantages of the invention is hence to delete the test limitations leading to the determination of the effectively optimal conditions, with or without a source tuner, in order to carry out the post-processing smoothly.

Furthermore, the formalism used to calculate the mismatching between a measured input impedance and a simulated source impedance is based on the use of an equivalent generator. The calculations described use variables representing tensions, currents and impedances. Another formalism may be used by employing for example power waves defined with respect to a reference impedance. The use of this same formalism thus only leads to the rewriting of the same equations based on the use of other variables.

In addition, the present invention employing measurement results associated to a calculation method may be equally used within a spreadsheet, a software program or any other digital tool.

The invention claimed is:

1. A method of determining an optimal source impedance at an input of a device under testing (DUT) in a measurement bench, comprising the steps of:

calibrating a source pull type bench as a measurement bench, adjusting a load impedance and continuous bias of the DUT, generating an electric power signal by a source and injected in the DUT, acquiring input impedances at the DUT and corresponding transducer power gain performances, wherein:

adjusting a theoretically-defined source impedance over a measured input impedance of the DUT, determining the acquisition of transducer power gain performances according to the theoretically-defined source impedance, to the input impedance measured in the plane of the DUT, as well as a net power injected at the DUT input and an output power of the DUT, determining a deviation in performance according to simulated mismatchings between the theoretically-defined source impedance and the input impedances of the DUT, and in the case where the deviation is higher than a reference value, theoretically defining at least one new source impedance until iteratively obtaining a deviation lower than the reference value, and determining transducer power gain performances of the DUT based on this source impedance.

2. A system for determining optimal source impedance at an input of a DUT comprising a measurement bench of calibrated source pull type, wherein said bench determines simulated input impedance values, for implementation of the method according to claim 1, using a vector network analyzer, and input and output power values of the DUT using couplers arranged respectively at the input and output of the DUT.

3. The system for determining optimal source impedance according to claim 2, wherein the bench comprises an input source tuner.

* * * * *